United States Patent [19]

Azumatani et al.

[11] Patent Number: 5,153,885
[45] Date of Patent: Oct. 6, 1992

[54] BIT ERROR MEASURING APPARATUS

[75] Inventors: Yasushi Azumatani; Isao Satoh, both of Neyagawa; Yoshihisa Fukushima, Osaka; Yuji Takagi, Kadoma; Hiroshi Hamasaka, Nishinomiya, all of Japan

[73] Assignee: Matsushita Electric Industrial Co., Ltd., Osaka, Japan

[21] Appl. No.: 579,028

[22] Filed: Sep. 7, 1990

[30] Foreign Application Priority Data

Sep. 18, 1989 [JP] Japan ................. 1-241254

[51] Int. Cl.$^5$ ........................... H03M 13/00
[52] U.S. Cl. ................................. 371/40.1
[58] Field of Search ............ 371/40.1, 37.4, 38.1, 371/39.1, 5.1, 27; 360/53

[56] References Cited

U.S. PATENT DOCUMENTS

| 4,206,440 | 6/1980 | Doi et al. ............. | 371/38.1 |
| 4,559,568 | 12/1985 | Watanabe et al. ...... | 371/38.1 |
| 4,788,685 | 11/1988 | Sako et al. ........... | 371/40.1 |
| 4,835,757 | 5/1989 | Abiko ................ | 360/53 |
| 4,841,498 | 6/1989 | Sugimura et al. ...... | 360/53 |
| 4,862,297 | 8/1989 | Fukami et al. ........ | 360/53 |
| 4,868,922 | 9/1989 | Tsuji et al. .......... | 360/53 |

OTHER PUBLICATIONS

"Error-Correcting Codes", Second Edition, W. Wesley Petersen et al., 1975, pp. 269-309.

Primary Examiner—Jerry Smith
Assistant Examiner—Phung My Chung
Attorney, Agent, or Firm—Wenderoth, Lind & Ponack

[57] ABSTRACT

A bit error measuring apparatus in which bit errors in a rewritable information recording medium are measured by reproducing data after the data have been repeatedly recorded on the medium, in which position of recording data used in random number data generated in a memory is periodically shifted every time recording is performed such that not only different recording data can be repeatedly recorded at a predetermined area of the medium at high speed but bit errors can be detected at identical bit locations of the medium by reproducing data from the predetermined area only when the identical recording data have been recorded.

5 Claims, 7 Drawing Sheets

BIT ERROR MEASURING APPARATUS

BACKGROUND OF THE INVENTION

1. Field of the Invention

The present invention generally relates to apparatuses for evaluating recording and reproducing characteristics of an information recording medium and more particularly, to a bit error measuring apparatus for measuring bit errors of a rewritable information recording medium after rewriting on the medium has been repeatedly performed.

2. Description of the Prior Art

Figure 1:
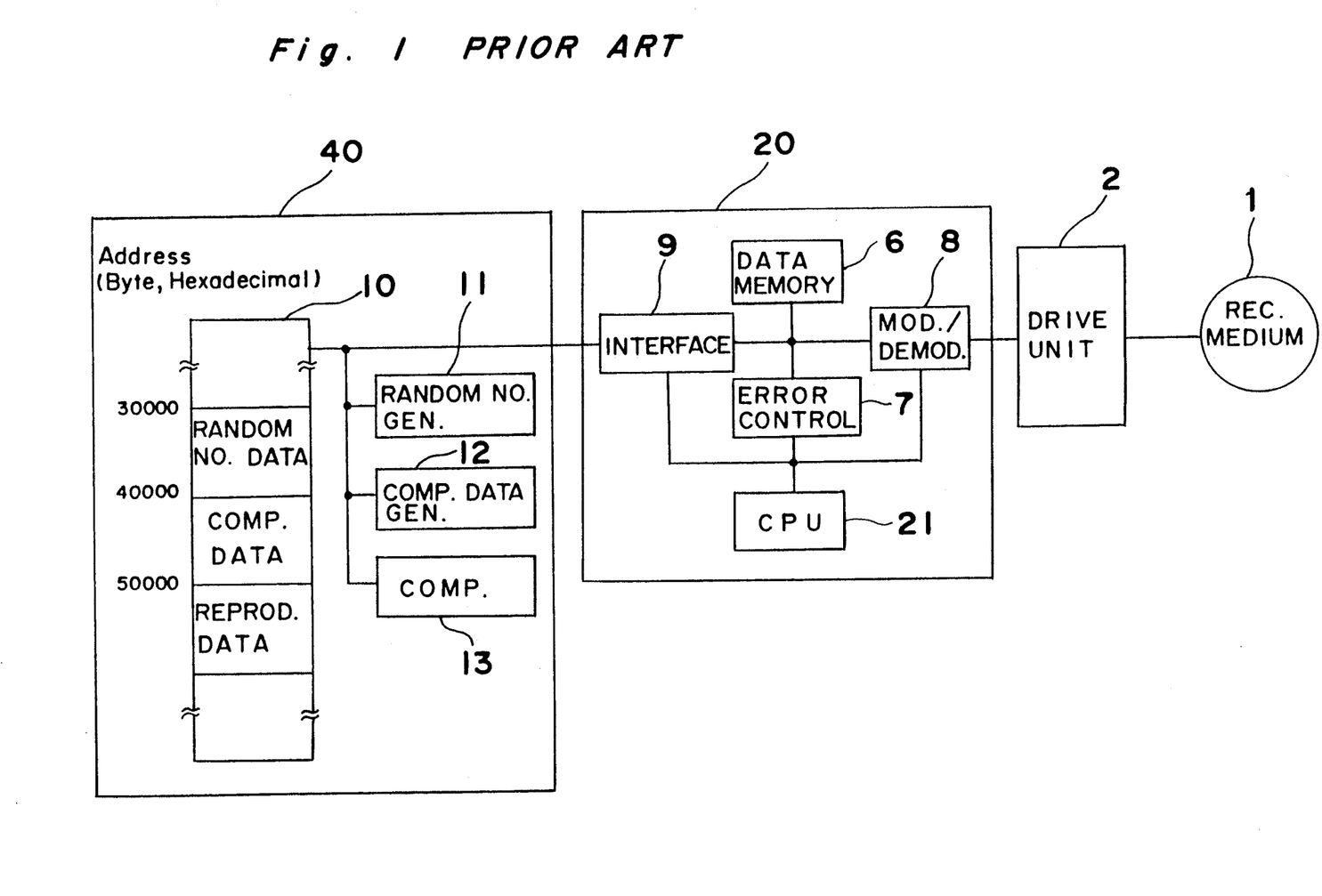
FIG. 1 is a schematic view of a prior art bit error measuring apparatus (already referred to)

FIG. 1 shows a known bit error measuring apparatus. The known bit error measuring apparatus includes an information recording medium 1 for recording and reproducing data, a drive unit 2 for recording signals on the information recording medium 1, a controller 20 for controlling the drive unit 2 during the recording and reproducing of the data and a host computer 40. The host computer 40 transmits commands and data to the controller 20 so as to record or reproduce the data on the information recording medium 1 through the drive unit 2. The controller 20 includes a control CPU 21 for controlling operation of the controller 20, a data memory 6 for temporarily storing recording data or reproduced data, an error controller 7 for adding error correction codes to the data of the data memory 6, a data modulator/demodulator 8 for modulating the data of the data memory 6 or, on the contrary, demodulating reproduction signals delivered from the drive unit 2 so as to store the demodulated reproduced signals in the data memory 6 and an interface 9 for connecting the controller 20 to the host computer 40.

The host computer 40 includes a random number generator 11 for generating random number data, a comparative data generator 12 for generating comparative data by adding the error correction codes to the random number data, a main memory 10 for storing the random number data, the comparative data and the reproduced data delivered from the controller 20 and a comparator 13 for detecting bit errors by comparing the reproduced data and the comparative data.

Figure 2:
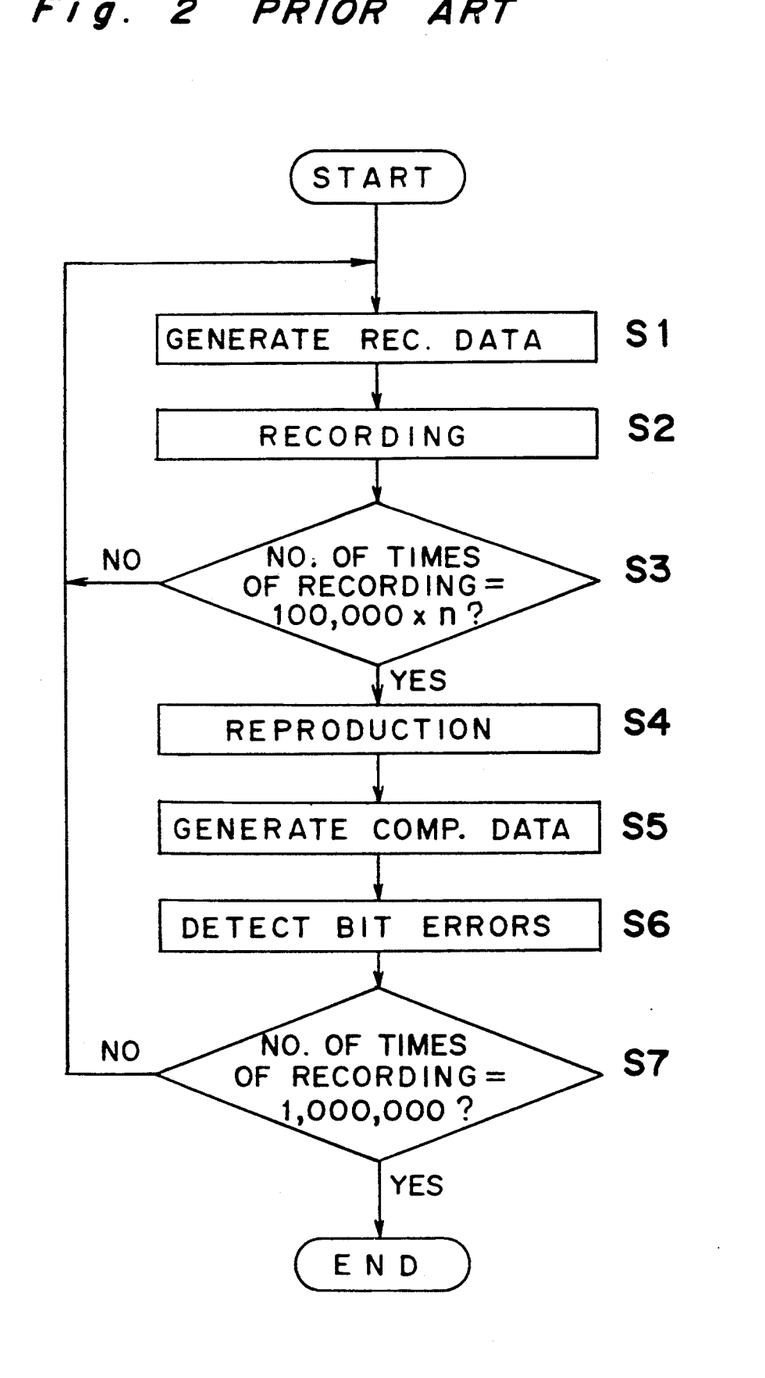
FIG. 2 is a flowchart showing operation of the prior art error measuring apparatus of FIG. 1 (already referred to)

Hereinbelow, a bit error measuring method employed in the known bit error measuring apparatus referred to above is described with reference to a flowchart of FIG. 2. In this example, rewriting is performed 1 million times in an area of 32,000 bytes and bit errors are measured at an interval of 100,000 times of rewriting. At step S1, random number data of 32,000 bytes corresponding to a recording area for measuring bit errors are generated by the random number generator 11 of the host computer 40 and are stored as recording data in the main memory 10 from address "30000h". It is to be noted that character h in the above address "30000h" represents a hexadecimal number. Then, at step S2, the host computer 40 delivers a WRITE command and the recording data of 32,000 bytes to the controller 20 via the interface 9. The control CPU 21 stores the recording data in the data memory 6, while the error controller 7 encodes the recording data and adds error correction codes to the recording data so as to generate encoded data. The encoded data are modulated by the data modulator/demodulator 8 so as to be recorded in a predetermined area of the information recording medium 1 by the drive unit 2, which area is allotted for measuring bit errors.

Subsequently, at step S3, a determination is made as to whether or not the number of times of recording is a multiple of 100,000 times which is an interval of the number of times of rewriting for measuring bit errors. In the case of "NO" at step S3, the program returns to step S1. On the other hand, in the case of "YES" at step S3, the host computer 40 delivers a READ command to the controller 20 at step S4. In response to a demand from the controller 20, the drive unit 2 reproduces the signals recorded in the predetermined area of the information recording medium 1 and the reproduced signals are demodulated by the data modulator/demodulator 8 so as to be stored in the data memory 6. The data stored in the data memory 6 are directly transferred to the host computer 40 by the control CPU 21 without passing through the error controller 7. Namely, without performing error correction, the control CPU 21 directly transfers the data together with the error correction codes, as reproduced data, from the data memory 6 to the host computer 40. The host computer 40 stores the reproduced data in the main memory 10 from address "50000h".

Thereafter, at step S5, the comparative data generator 12 fetches the recording data of 32,000 bytes stored in the main memory 10 from address "30000h" and adds the error correction codes thereto so as to store the recording data as comparative data in the main memory 10 from address "40000h". Then, at step S6, the comparator 13 of the host computer 40 compares the reproduced data stored in the main memory 10 from address "50000h", with the comparative data of step S5 stored in the main memory 10 from address "40000h" so as to detect bit errors. Finally, at step S7, a decision is made as to whether or not the number of times of recording has reached 1,000,000 times which is the preset maximum of times of rewriting. In the case of "NO" at step S7, the program returns to step S1.

In the above mentioned known bit error measuring apparatus, since different random number data are recorded each time for the purpose of evaluating, substantially in a state where users record various data, deterioration of the information recording medium due to repeated recording, the random number data are calculated by the host computer each time the random number data are recorded, so that a long time is required for performing processing. Furthermore, since measurements of bit errors at an interval of 100,000 times of rewriting are performed based on different recording data each time, such a problem arises that it is impossible to measure bit errors under an identical processing condition.

SUMMARY OF THE INVENTION

Accordingly, an essential object of the present invention is to provide a bit error measuring apparatus which is capable of measuring bit errors not only at high speed by generating different random number data from a small amount of data generated by a host computer but under an identical processing condition.

In order to accomplish this object of the present invention, there is provided a bit error measuring apparatus in which bit errors on an information recording medium are measured by reproducing data on said information recording medium after the data have been repeatedly recorded on said information recording medium, said bit error measuring apparatus comprising:

a generation means for generating random number data;

a storage means for storing the random number data in a memory;

an address designating means for designating a foremost address of recording data in the random number data stored in said memory and for periodically shifting the foremost address of the recording data each time recording is performed;

a recording means for repeatedly recording the recording data in a predetermined area of said information recording medium;

a reproduction means for reproducing data, which, assuming that a time period for shifting the foremost address of the recording data includes a plurality of smaller time periods, reproduces data from said predetermined area so as to generate reproduced data only when the recording data having the foremost address at a first one of the plurality of smaller time periods have been recorded upon the passage of the time period for shifting; and a comparison means which compares the reproduced data with the recording data having the foremost address at the first one of the plurality of smaller time periods so as to detect bit errors in the reproduced data.

By the above described arrangement of the bit error measuring apparatus of the present invention, the recording data are repeatedly recorded at the predetermined area of the information recording medium by periodically shifting position of the recording data in the random number data every time recording is performed and data are reproduced from the predetermined area only when the identical recording data have been recorded so as to generate the reproduced data. Thus, in accordance with the present invention, by detecting bit errors in the reproduced data, it becomes possible to not only generate different recording data at high speed but detect bit errors from the identical recording data.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DESCRIPTION OF THE PREFERRED EMBODIMENTS

Figure 3:
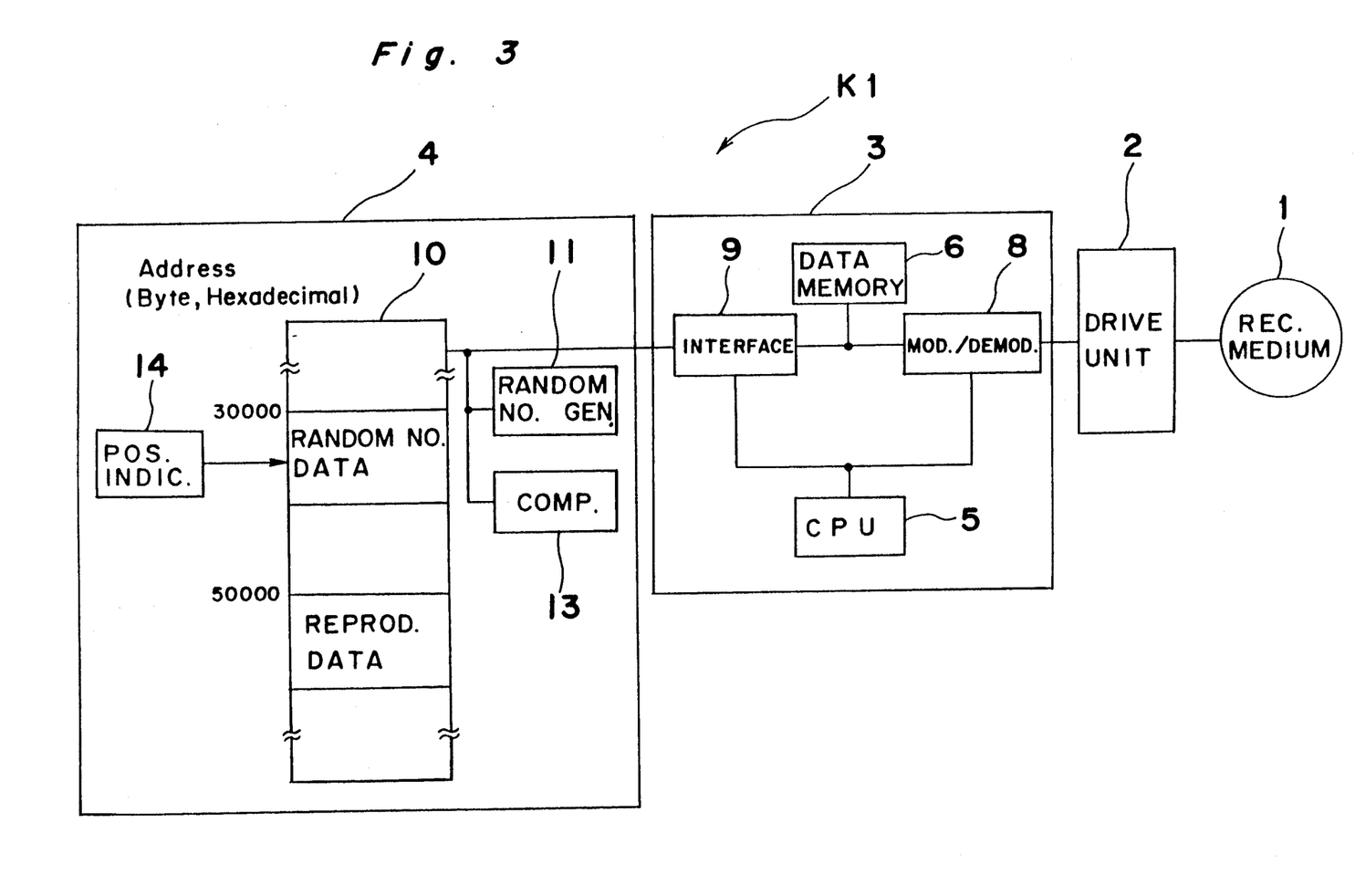
FIG. 3 is a schematic view of a bit error measuring apparatus according to a first embodiment of the present invention.
Figure 4:
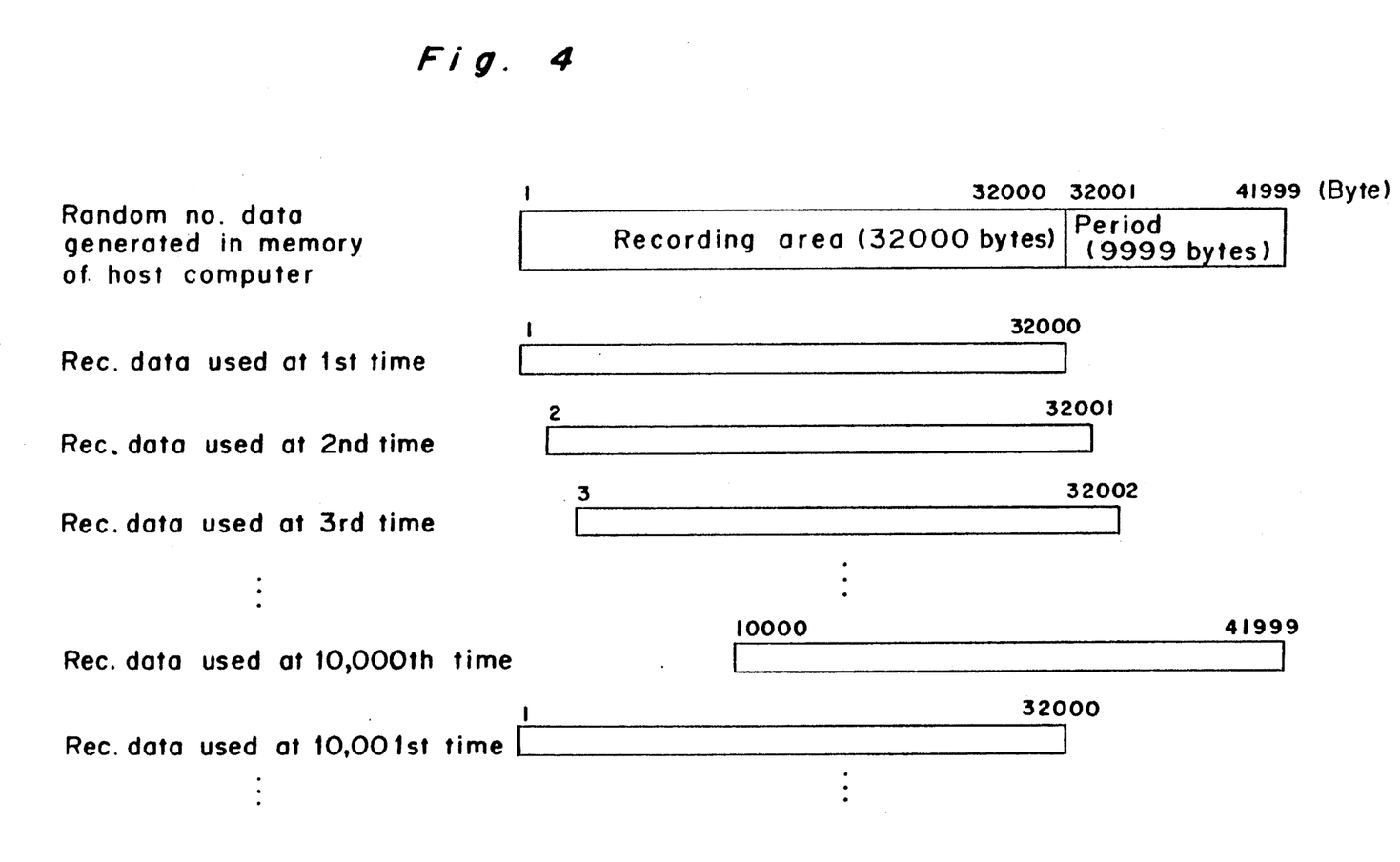
FIG. 4 is a view explanatory of random number data generated in a main memory of a host computer and recording data occupying a portion of the random number data in the bit error measuring apparatus of FIG. 3.
Figure 5:
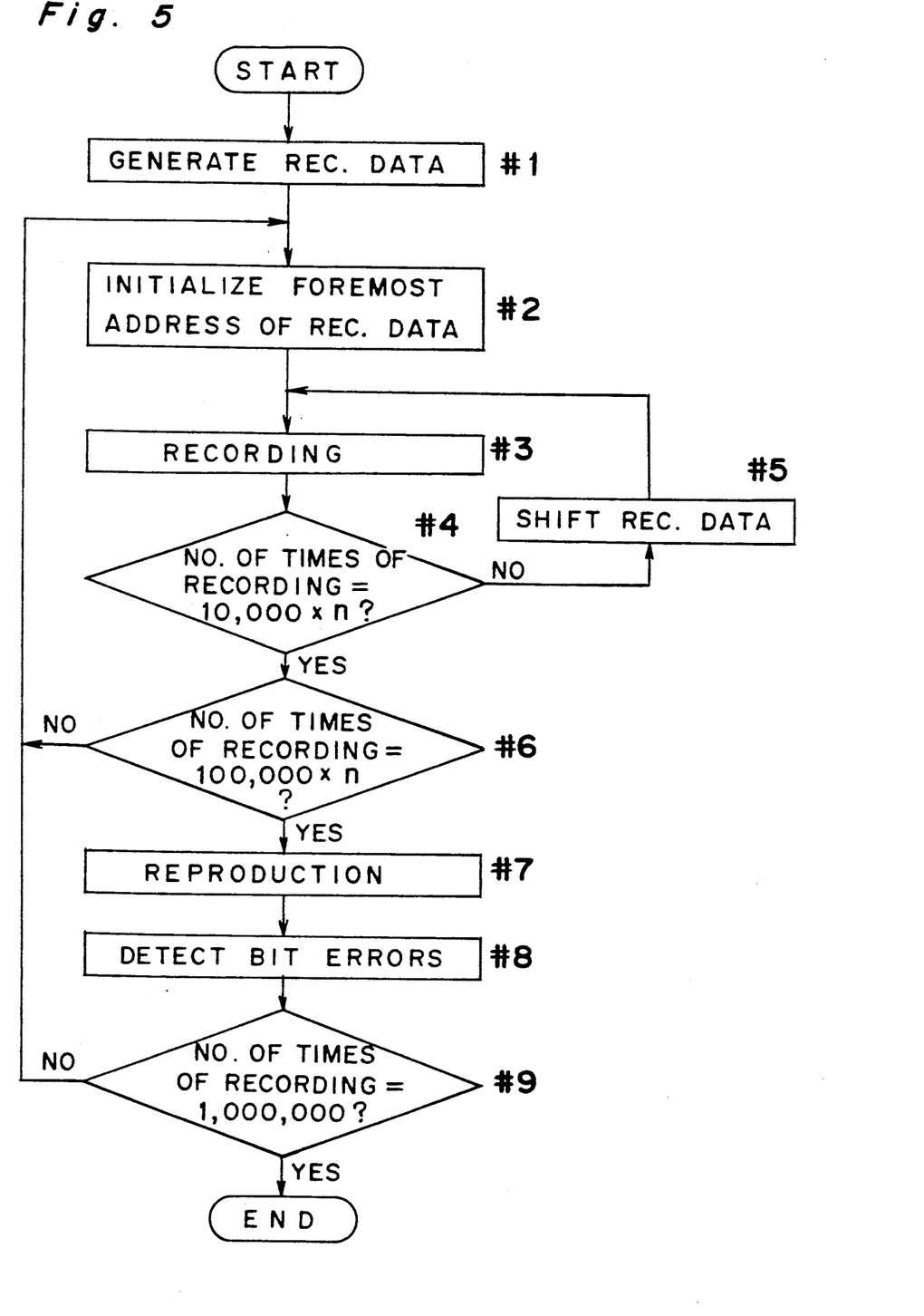
FIG. 5 is a flowchart showing operation of the bit error measuring apparatus of FIG. 3.

Referring now to the drawings, there is shown in FIGS. 3 to 5, a bit error measuring apparatus K1 according to a first embodiment of the present invention. In this embodiment, rewriting is performed 1 million times and bit errors are measured at an interval of 100,000 times of rewriting. In FIG. 3, the bit error measuring apparatus K1 includes an information recording medium 1 for recording and reproducing data, a drive unit 2 for recording and reproducing signals on the information recording medium 1, a controller 3 for controlling the drive unit 2 in recording and reproduction of the data and a host computer 4. The information recording medium 1 has a disklike shape and is constituted by a plurality of sectors. The host computer 4 transmits commands and data to the controller 3 so as to record or reproduce the data on the information recording medium 1 through the drive unit 2. The controller 3 includes a control CPU 5 for controlling operation of the controller 3, a data memory 6 for temporarily storing recording data or reproduction data, a data modulator/demodulator 8 for modulating the data of the data memory 6 or, on the contrary, demodulating reproduced signals delivered from the drive unit 2 so as to store the demodulated reproduced signals in the data memory 6 and an interface 9 for connecting the controller 3 and the host computer 4.

Meanwhile, the host computer 4 includes a random number generator 11 for generating random number data, a main memory 10 for storing the random number data and the reproduced data delivered from the controller 3, a comparator 13 for detecting bit errors by comparing the random number data and the reproduction data and a position indicator 14 for designating a foremost address used as recording data of the random number data stored in the main memory 10 by periodically shifting the foremost address each time recording is performed.

FIG. 4 shows the random number data generated in the main memory 10 by the random number generator 11 and the recording data occupying a portion of the random number data. In FIG. 4, the random number data generated in the main memory 10 have a length constituted by addition of the number of bytes of a recording area for measuring bit errors of the information recording medium 1 and period for changing position used for the recording data. It is assumed here that 32,000 bytes are allocated for the recording area for measuring bit errors of the information recording medium 1 and period for changing position used for the recording area is set at 10,000 times such that 100,000 times, i.e. an interval for measuring bit errors in rewriting is a multiple of this period.

The recording data designated by the position indicator 14 are used by the host computer 4 as follows. At the first recording, the host computer 4 uses data of 32,000 bytes from the foremost byte (first byte). At the second recording, the host computer 4 uses data of 32,000 bytes from the second byte. Subsequently, position of the initial byte is likewise shifted rearwards one byte by one byte. Thus, at the 10,000th recording, the host computer 4 uses data of 32,000 bytes from the 10,000th byte. Then, at the 10,001st recording, the host computer 4 uses data of 32,000 bytes from the first byte as in the first recording such that the above described operation is thereafter repeated at a period of 10,000 times.

Hereinbelow, a bit error measuring method employed in the bit error measuring apparatus K1 of the above described arrangement by using the recording data shown in FIG. 4 is described with reference to a flowchart of FIG. 5. At step #1, random number data of 41,999 bytes which are obtained by a sum of capacity of the recording area for measuring bit errors of the information recording medium 1 and the period for changing position used for the recording data are generated by the random number generator 11 of the host computer 4 and are stored in the main memory 10 from address "30000h". Then, at step #2, the position indicator 14 of the host computer 4 sets the foremost address of the recording data at address "30000h" of the main memory 10. Subsequently, at step #3, the host computer 4 delivers, through the interface 9, to the controller 3, a WRITE command and the recording data of 32,000 bytes from the foremost address of the recording data. The control CPU 5 stores the recording data in the data memory 6. The data modulator/demodulator 8 fetches the recording data from the data memory 6 and modulates the recording data by (2, 7) RLLC (Run Length Limited Code) modulation method so as to deliver, as recording signals, the modulated recording data. The drive unit 2 records the recording signals in the predetermined area of the information recording medium 1, which area is allotted for measuring bit errors in the information recording medium 1. Then, if it is found at step #4 that the number of times of recording is not a multiple of the period of 10,000 times, the position indicator 14 adds one byte to the foremost address of the recording data at step #5 and the program flow returns to step #3.

Subsequently, at step #6, a determination is made as to whether or not the number of times of recording is a multiple of 100,000 times which is an interval for measuring bit errors in rewriting. In the case of "NO" at step #6, the program flow returns to step #2. On the other hand, in the case of "YES" at step #6, the host computer 4 delivers a READ command to the controller 3 at step #7. In response to a demand from the controller 3, the drive unit 2 reproduces the signals recorded in the predetermined area of the information recording medium 1 and delivers the reproduced signals to the controller 3. The data modulator/demodulator 8 demodulates the reproduced signals so as to store the demodulated data in the data memory 6. Meanwhile, the data stored in the data memory 6 are transferred, as reproduced data, to the host computer 4 by the control CPU 5. The host computer 4 stores the reproduced data in the main memory 10 from address "50000h".

Subsequently, at step #8, the comparator 13 of the host computer 4 detects bit errors by comparing the reproduced data of 32,000 bytes stored in the main memory 10 from address "50000h", with the recording data of 32,000 bytes stored in the main memory 10 from address "30000h+9999". Finally, at step #9, a determination is made as to whether or not the number of times of recording has reached 1,000,000 times which is the preset maximum of times of rewriting. In the case of "NO" at step #9, the program flow returns to step #2.

Meanwhile, in this embodiment, the random number generator 6, the position indicator 14 and the comparator 13 can also be replaced by software by employing a microprocessor.

As is clear from the foregoing description, since the recording data obtained by shifting, one byte by one byte, the random number data generated by the host computer 4 are modulated by the (2, 7) RLLC modulation method such that the modulated data are recorded in the information recording medium 1. Therefore, in this embodiment, amount of the generated data is reduced and different data can be recorded at high speed. Furthermore, in this embodiment, since the identical recording data are used every time bit errors are detected, it becomes possible to detect bit errors at identical bit locations of the information recording medium 1.

Figure 6:
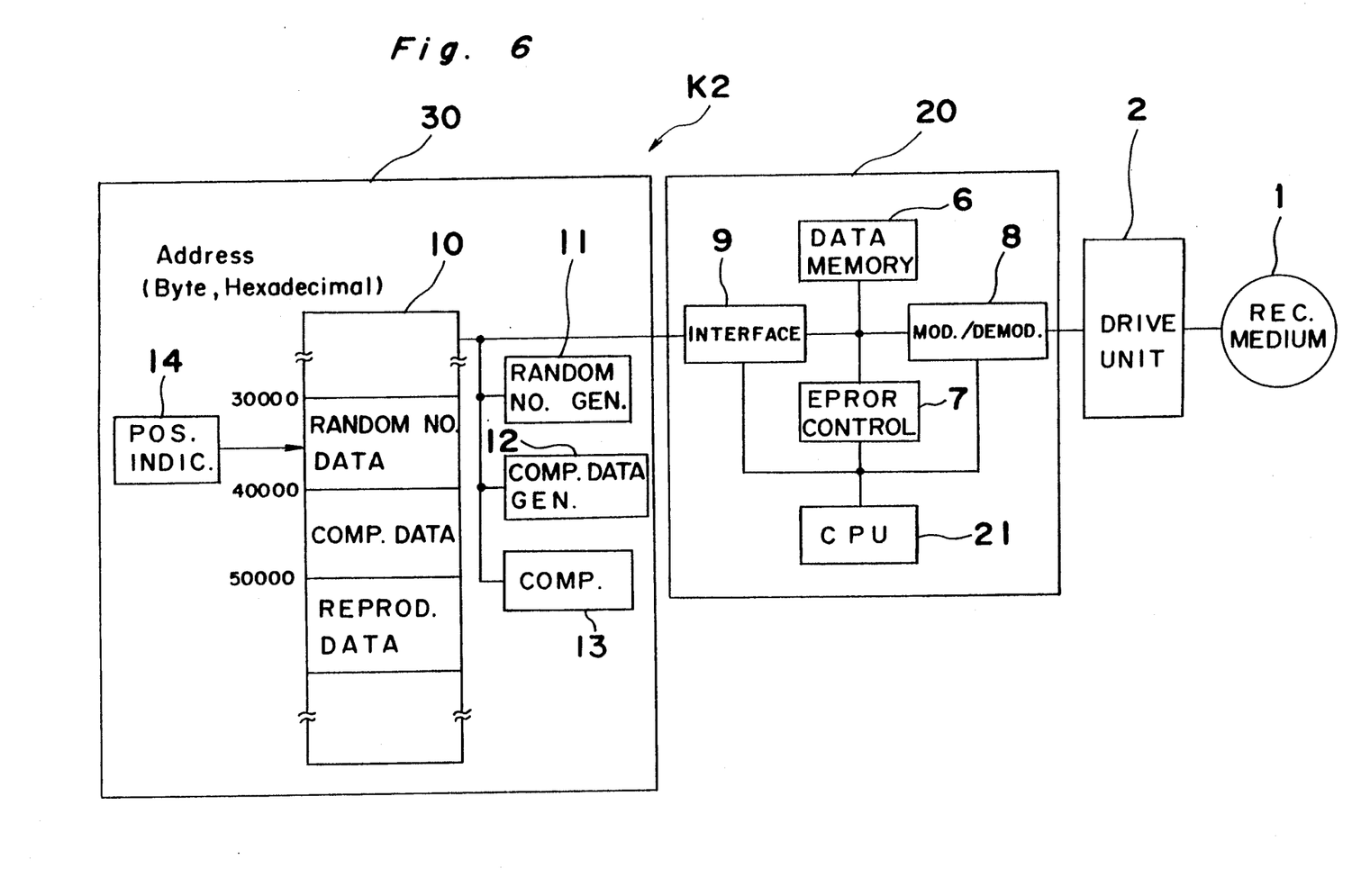
FIG. 6 is a view similar to FIG. 3, particularly showing a second embodiment of the present invention.

FIG. 6 shows a bit error measuring apparatus K2 according to a second embodiment of the present invention. The bit error measuring apparatus K2 includes the information recording medium 1, the drive unit 2, a controller 20 and a host computer 30. The controller 20 includes a control CPU 21 for controlling operation of the controller 20, the data memory 6, an error controller 7 for adding error correction codes to the data of the data memory 6, the data modulator/demodulator 8 and the interface 9.

Meanwhile, the host computer 30 includes the random number generator 11, a comparative data generator 12 for generating comparative data by adding the error correction codes to the random number data, the main memory 10 for storing the random number data, the comparative data and the reproduction data delivered from the controller 20, the comparator 13 for detecting bit errors by comparing the reproduction data and the comparative data and the position indicator 14. The random number data and the recording data occupying a portion of the random number data, which are employed in the bit error measuring apparatus K1 as shown in FIG. 4, are also used in the bit error measuring apparatus K2.

Figure 7:
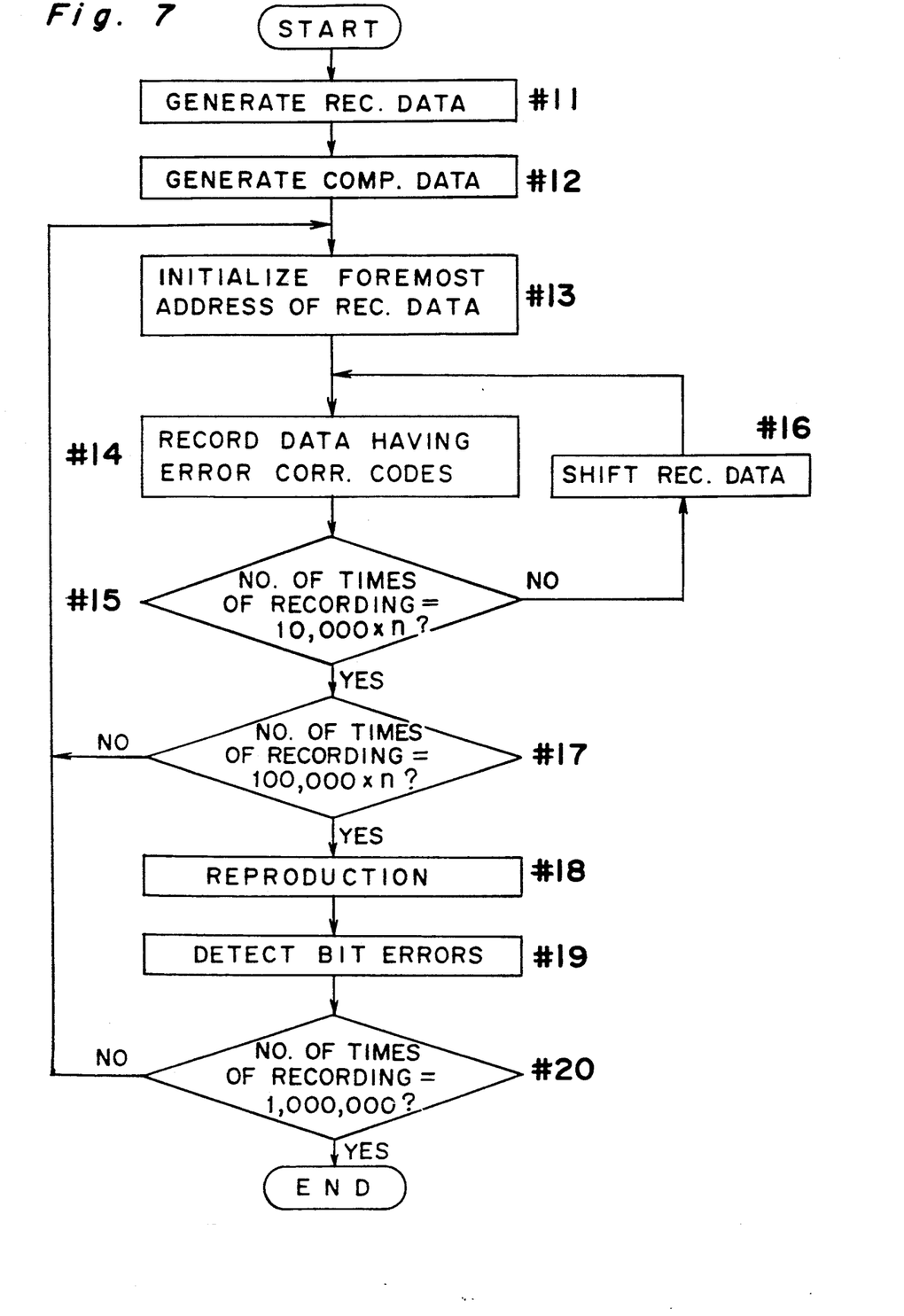
FIG. 7 is a flowchart showing operation of the bit error measuring apparatus of FIG. 6.

Hereinbelow, a bit error measuring method employed in the bit error measuring apparatus K2 of the above described arrangement by using the recording data shown in FIG. 4 is described with reference to a flowchart of FIG. 7. In this embodiment, the data in which the error correction codes have been added to the recording data by the error controller 7 are recorded in the information recording medium 1 by the drive unit 2. At step #11, random number data of 41,999 bytes which are obtained by a sum of capacity of the recording area for measuring bit errors of the information recording medium 1 and the period for changing position used for the recording data are generated by the random number generator 11 of the host computer 30 so as to be stored in the main memory 10 from address "30000h". Then, at step #12, the error correction codes are added to 32,000 bytes from address "(30000h+9999)" of the main memory 10 by the comparative data generator 12 so as to be stored in the main memory 10 from address "40000h".

Subsequently, at step #13, the position indicator 14 of the host computer 30 sets the foremost address of the recording data at address "30000h" of the main memory 10. Thereafter, at step #14, the host computer 30 delivers, through the interface 9, to the controller 20, a WRITE command and the recording data of 32,000 bytes from the foremost address of the recording data. The control CPU 21 stores the recording data in the data memory 6. Meanwhile, the error controller 7 reads the recording data from the data memory 6 and adds the error correction codes to the recording data so as to again store the recording data in the data memory 6. The data modulator/demodulator 8 fetches the recording data and the error correction codes from the data memory 6 and modulates the data by the (2, 7) RLLC modulation method so as to deliver, as recording signals, the modulated data. The drive unit 2 records the recording signals in the predetermined area of the information recording medium 1, which area is allotted for measuring bit errors in the information recording medium 1. Then, if it is found at step #15 that the number of times of recording is not a multiple of the period of 10,000 times, the position indicator 14 adds one byte to the foremost address of the recording data at step #16 and the program flow returns to step #14.

Subsequently, at step #17, a determination is made as to whether or not the number of times of recording is a multiple of 100,000 times which is an interval for measuring bit errors in rewriting. In the case of "NO" at step #17, the program flow returns to step #13. On the contrary, in the case of "YES" at step #17, the host computer 30 delivers a READ command to the controller 20 at step #18. In response to a demand from the controller 20, the drive unit 2 reproduces the signals recorded in the predetermined area of the information recording medium 1 and delivers the reproduced signals to the controller 20. The data modulator/demodulator 8 demodulates the reproduced signals so as to store the demodulated data in the data memory 6. Meanwhile, the data stored in the data memory 6 are transferred, as reproduction data, to the host computer 30 by the control CPU 21. The host computer 30 stores the reproduction data in the main memory 10 from address "50000h". Then, at step #19, the comparator 13 of the host computer 30 detects bit errors by comparing the reproduced data and the comparative data stored in the main memory from addresses "50000h" and "40000h", respectively, with the error correction codes being added to both the reproduced data and the comparative data. Finally, at step #20, it is judged whether or not the number of times of recording has reached 1,000,000 times which is the preset maximum of times of rewriting. In the case of "NO" at step #20, the program flow returns to step #13.

As described above, in the bit error measuring apparatus K2 according to the second embodiment of the present invention, the controller 20 adds the error correction codes to the recording data obtained by shifting, one byte by one byte, the random number data generated by the host computer 30 and then, the recording data are modulated by the (2, 7) RLLC modulation method such that the modulated data are recorded in the information recording medium 1. Therefore, in the second embodiment of the present invention, amount of the generated data is reduced and different data can be recorded at high speed. Furthermore, in the second embodiment of the present invention, since bit errors can be measured at an area which is larger, by amount of the error correction codes, than amount of the data delivered from the host computer 30 to the controller 20, it becomes possible to shorten the period required, per area for measuring bit errors, for transferring the data from the host computer 30 to the controller 20.

Moreover, in the second embodiment of the present invention, since the identical recording data are used every time bit errors are detected, bit errors can be detected repeatedly by performing calculation of the error correction codes only once initially by the host computer 30 and it is possible to detect bit errors at identical bit locations of the information recording medium 1.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A bit error measuring apparatus in which bit errors on an information recording medium are measured by reproducing data on said information recording medium after the data have been repeatedly recorded on said information recording medium, said bit error measuring apparatus comprising:

a generation means for generating random number data;

a storage means for storing the random number data in a memory;

an address designating means for designating a foremost address of recording data in the random number data stored in said memory and for periodically shifting the foremost address of the recording data each time recording is performed;

a recording means for repeatedly recording the recording data in a predetermined area of said information recording medium;

a reproduction means for reproducing data, which, assuming that a time period for shifting the foremost address of the recording data includes a plurality of smaller time periods, reproduces data from said predetermined area so as to generate reproduced data only when the recording data having the foremost address at a first one of the plurality of smaller time periods have been recorded upon the passage of the time period for shifting; and a comparison means which compares the reproduced data with the recording data having the foremost address at the first one of the plurality of smaller time periods so as to detect bit errors in the reproduced data.

2. A bit error measuring apparatus as claimed in claim 1, which is constituted by an information recording and reproducing device and a host computer;

wherein said host computer comprises said generation means, said storage means, said address designating means and said comparison means.

3. A bit error measuring apparatus as claimed in claim 1, wherein said address designating means periodically shifts, one byte by one byte, the foremost address of the recording data each time recording is performed.

4. A bit error measuring apparatus as claimed in claim 1, wherein said recording means includes a means for adding error correction codes to the recording data so as to record in said information recording medium, the recording data having the error correction codes added thereto;

wherein said reproduction means reproduces the recording data recorded in said information recording medium so as to generate the reproduced data which contains the error correction codes without being subjected to error correction;

wherein said comparison means includes a means for calculating the error correction codes added to the recording data by said recording means and for comparing the recording data having the error correction codes added thereto with the reproduced data containing the error correction codes so as to detect the bit errors in the reproduced data.

5. A bit error measuring apparatus as claimed in claim 4, which is constituted by an information recording and reproducing device and a host computer;

wherein said host computer comprises said generation means, said storage means, said address designating means and said comparison means.

* * * * *